United States Patent [19]

Yamauchi

[11] Patent Number: 5,295,103
[45] Date of Patent: Mar. 15, 1994

[54] READ/WRITE CIRCUIT INCLUDING SENSE AMPLIFIERS FOR USE IN A DYNAMIC RAM

[75] Inventor: Hiroyuki Yamauchi, Osaka, Japan

[73] Assignee: Matsushita Electric Industrial Co., Ltd., Osaka, Japan

[21] Appl. No.: 871,185

[22] Filed: Apr. 20, 1993

[30] Foreign Application Priority Data

Apr. 19, 1991 [JP] Japan .................... 3-088196
Jul. 5, 1991 [JP] Japan .................... 3-165446

[51] Int. Cl.$^5$ .................... G11C 7/00; G11C 7/02; G11C 11/00
[52] U.S. Cl. .................... 365/205; 365/156; 365/207
[58] Field of Search .................... 365/205, 156, 207

[56] References Cited

U.S. PATENT DOCUMENTS

| | | | |
|---|---|---|---|
| 4,403,306 | 9/1983 | Tokushige et al. | 365/156 |
| 4,829,483 | 5/1989 | Ogihara | 365/205 |
| 4,858,193 | 8/1989 | Furutani et al. | 365/207 |
| 4,947,373 | 8/1990 | Yamaguchi et al. | 365/207 |
| 4,954,992 | 9/1990 | Kumanoya et al. | 365/207 |
| 4,973,864 | 11/1990 | Nogami | 365/205 |
| 5,027,325 | 6/1991 | Katsura | 365/205 |
| 5,091,885 | 2/1992 | Ohsawa | 365/205 |
| 5,132,930 | 7/1992 | Furutani et al. | 365/205 |
| 5,208,771 | 5/1993 | Shikata | 365/205 |

FOREIGN PATENT DOCUMENTS

1-69798 7/1989 Japan .
1264692 10/1989 Japan .
2-9081 11/1990 Japan .

*Primary Examiner*—Eugene R. LaRoche
*Assistant Examiner*—Michael C. Kessell
*Attorney, Agent, or Firm*—Ratner & Prestia

[57] ABSTRACT

A read/write circuit for use in a dynamic RAM includes transistors connected in series between a pair of bit lines. A gate of the second transistor is connected to one bit line, a gate of the third transistor is connected to another bit line. A write control signal is provided to the gate of each of the first and fourth transistors. During a writing cycle, the gate control signal opens the gate circuit, and then the write control signal enables the first and fourth transistors to enable access from the data buses to the pair of bit lines, and during a reading cycle, the write control signal disables the first and fourth transistors to produce an amplified bit line data between the second and third transistors, and then the gate control signal opens the gate circuit to supply the amplified bit line data to the data buses.

11 Claims, 19 Drawing Sheets

READ/WRITE CIRCUIT INCLUDING SENSE AMPLIFIERS FOR USE IN A DYNAMIC RAM

BACKGROUND OF THE INVENTION

1. Field of the Invention

The present invention relates to a read/write circuit for dynamic RAM devices, and particularly to a technology that is effective with direct bit bus sensing dynamic RAM devices to which the potential of a bit bus pair is input to a MOSFET gate pole to transfer data over a common data bus according to the MOSFET ON resistance resulting from the input potential.

2. Prior Art

The prior art is described below with reference to FIGS. 1 to 3.

A sense amplifier circuit is added to read data from non-addressable multiplex DRAM (c.f., Ref. 1: K. Yanagisawa, et al., 1989 ESSCIRC, pp. 184–187) and low-voltage 64 Mbit DRAM (c.f., Ref. 2: Y. Nakagome, et al., 1990 Symposium on VLSI Circuits, pp. 17–18) devices. The cross-cut flip-flop sense amplifier circuit (T9, T10, T11, and T12 in FIG. 1) is a common conventional DRAM sense amplifier circuit. In another type of sense amplifier circuit that may be used, the bit bus potential is applied to the MOSFET T1, T2 gate pole, and the ground bus (Vss) and common data buses CD and $\overline{CD}$ are connected by the ON resistance of the MOSFETs T1 and T2 and the MOSFETs T3 and T4 controlled by the column selection bus Yn selected by the column decoding circuit 5, thus enabling the data to be read and keeping the bit buses BL and $\overline{BL}$ and the common data buses CD and $\overline{CD}$ electrically separated.

These technologies were introduced because the floating capacity of the common data buses CD, $\overline{CD}$ increases as the degree of integration of the DRAM device increases, and the current drive power of the sense amplifier transistors T9, T10, T11, T12 decreases as the voltage decreases. As a result, if the bit bus and the common data bus are switch connected before the bit bus is sufficiently amplified, the data on the bit bus will be lost. This insufficient amplification of the bit bus is therefore an impediment to increasing the processing speed of the DRAM device. Bit bus direct sensing technologies were therefore introduced to electrically separate and read the bit bus and common data bus.

When the bit bus and common data bus are electrically separated as described above, however, the common data buses CD, $\overline{CD}$ cannot be used as both input and output buses, and an input data bus pair CID, $\overline{CID}$ must be provided in addition to the common data buses CD, $\overline{CD}$. Furthermore, two MOSFETs T1 and T2 for bit bus potential sensing, and four MOSFETs T5-T8 separating the input data bus pair CID, $\overline{CID}$ and the bit bus pair BL, $\overline{BL}$ must be provided in addition to the conventional bit bus refreshing CMOS sense amplifier circuit composed of four MOSFETs T9-T12. These additional devices necessarily increase the chip size.

The bit bus pair BL, $\overline{BL}$ is not shown in FIG. 1 because it is not directly related to the present invention, but a bit bus equalizer and precharge circuit as described in Ref. 1 and Ref. 2 is, of course, connected to provide a half precharge.

The circuits shown in FIGS. 2 and 3 that are functionally identical to equivalent circuits in the preferred embodiment described below are next described.

The sense amplifier drive circuits SAD 12 are controlled by the sense amplifier activation signal, and control the sense amplifier driver. The SAD 12 also include a circuit to precharge the common source buses NS and PS of the sense amplifier circuit. The main amplifier circuits MA 13 detect and amplify the signals on the common data buses CD, $\overline{CD}$ during the read cycle of DRAM operation, and are controlled via the control bus RMA. The main amplifier circuits MA are not activated during the write cycle. The outputs of the write circuit WCKT 9 are connected to the input data bus pair CID, $\overline{CID}$ provided separately to the common data buses. The write timing signal WG 10$^-$ is generated according to the external write enable signal /WE and the column control bus. Switch control buses TGn 7 are also provided for separating the sense amplifier circuits.

When the bit bus pair BL, $\overline{BL}$ and common data bus are thus electrically separated, however, the common data buses cannot be used as both input and output buses, and a common input data bus pair CID, $\overline{CID}$ must be provided in addition to the common data buses CD, $\overline{CD}$. Furthermore, two MOSFETs T1 and T2 for bit bus potential sensing, and four MOSFETs T5-T8 separating the input data bus pair CID, $\overline{CID}$ and the bit bus pair BL, $\overline{BL}$ must be provided in addition to the conventional bit bus refreshing CMOS sense amplifier circuit composed of four MOSFETs T9-T12. These additional devices necessarily increase the chip size.

SUMMARY OF THE INVENTION

Therefore, an object of the present invention is to provide a dynamic RAM device read circuit that enables increased RAM capacity and increased operating speed while stabilizing operation.

To achieve this object, a dynamic RAM read circuit according to the present invention is a sense amplifier circuit connected separately to plural bit bus pairs, and is characterized by each of the transistor pairs composing the first sense amplifier circuit group being serially connected transistors. The gate pole of the transistor connected to the common source bus, i.e., the first transistor in this transistor pair, is connected to one of the bit buses. The gate pole of the second transistor, which is connected to the other bit bus, which is the electrical complement of the first bit bus, is connected to a first control bus. The connection node of the serial transistors and one bus of the common data bus pair are connected through a third transistor, which is controlled by a second control bus.

The present invention, therefore, does not need the common input data bus pair CID, $\overline{CID}$, the two bit line potential sensing MOSFETs Q1 and Q2, and the four MOSFETs Q5-Q8 separating the common input data bus pair and the bit bus pair because of the addition of two MOSFETs Q13 and Q14 serially to the NMOS sense amplifier transistors Q11 and Q12 in the bit bus refreshing CMOS sense amplifier circuit conventionally composed of four MOSFETs Q9-Q12. Furthermore, by eliminating these devices the increase in chip size can be prevented.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DESCRIPTION OF PREFERRED EMBODIMENTS

First embodiment

Figure 4:
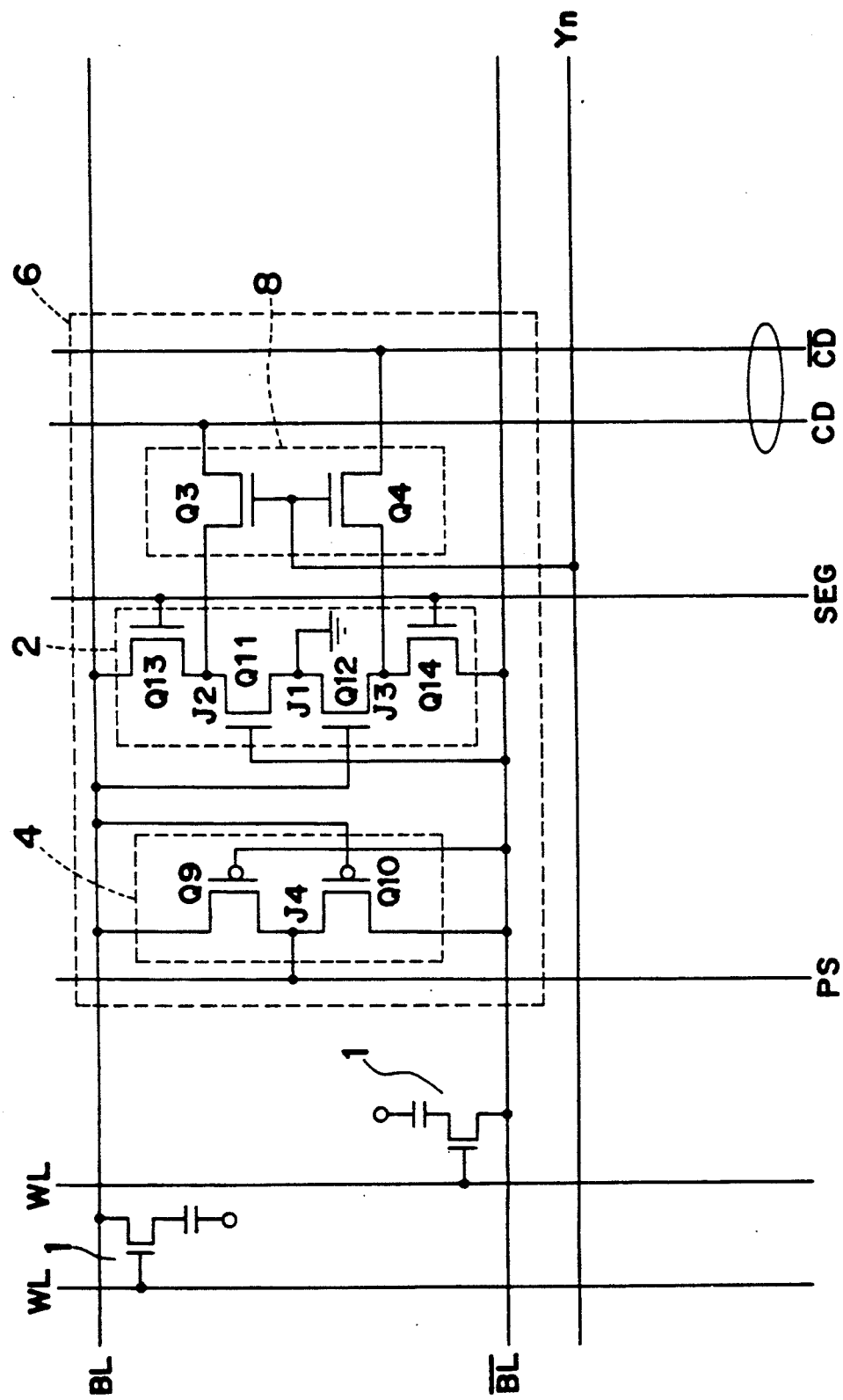
FIG. 4 is a circuit diagram of a sense amplifier according to a first embodiment of the present invention.

Referring to FIG. 4, a circuit diagram of a sense amplifier 6 for use in a dynamic RAM according to a first embodiment of the present invention is shown.

The sense amplifier 6 comprises a first sense amplifier circuit 2, a second sense amplifier circuit 4, and a gate circuit 8.

The first sense amplifier circuit 2 has four N-type MOSFETs Q11, Q12, Q13, and Q14 connected in series between a pair of bit lines BL and $\overline{BL}$. The MOSFETs Q13 and Q14 connected to the bit lines BL and $\overline{BL}$ have their gate connected to a first control bus SEG. The gates of MOSFETs Q11 and Q12 are connected, respectively, to bit lines $\overline{BL}$ and BL. A junction J1 between MOSFETs Q11 and Q12 is connected to ground.

The second sense amplifier circuit 4 has two P-type MOSFETs Q9 and Q10 connected in series between the bit lines BL and $\overline{BL}$. The gates of MOSFETs Q9 and Q10 are connected, respectively, to bit lines $\overline{BL}$ and BL.

A junction J4 between MOSFETs Q9 and Q10 is connected to a source bus PS.

The gate circuit 8 includes MOSFETs Q3 and Q4, in which MOSFET Q3 is connected between a data bus CD and a junction J2 between MOSFETs Q11 and Q13, and MOSFET Q4 is connected between a data bus $\overline{CD}$ and a junction J3 between MOSFETs Q12 and Q14. The gates of MOSFETs Q3 and Q4 are connected to a column selection bus Yn, which is the second control bus. A memory cell 1 includes a transistor and capacitor and is connected to a word line and one of a bit line BL or $\overline{BL}$.

Figure 2:
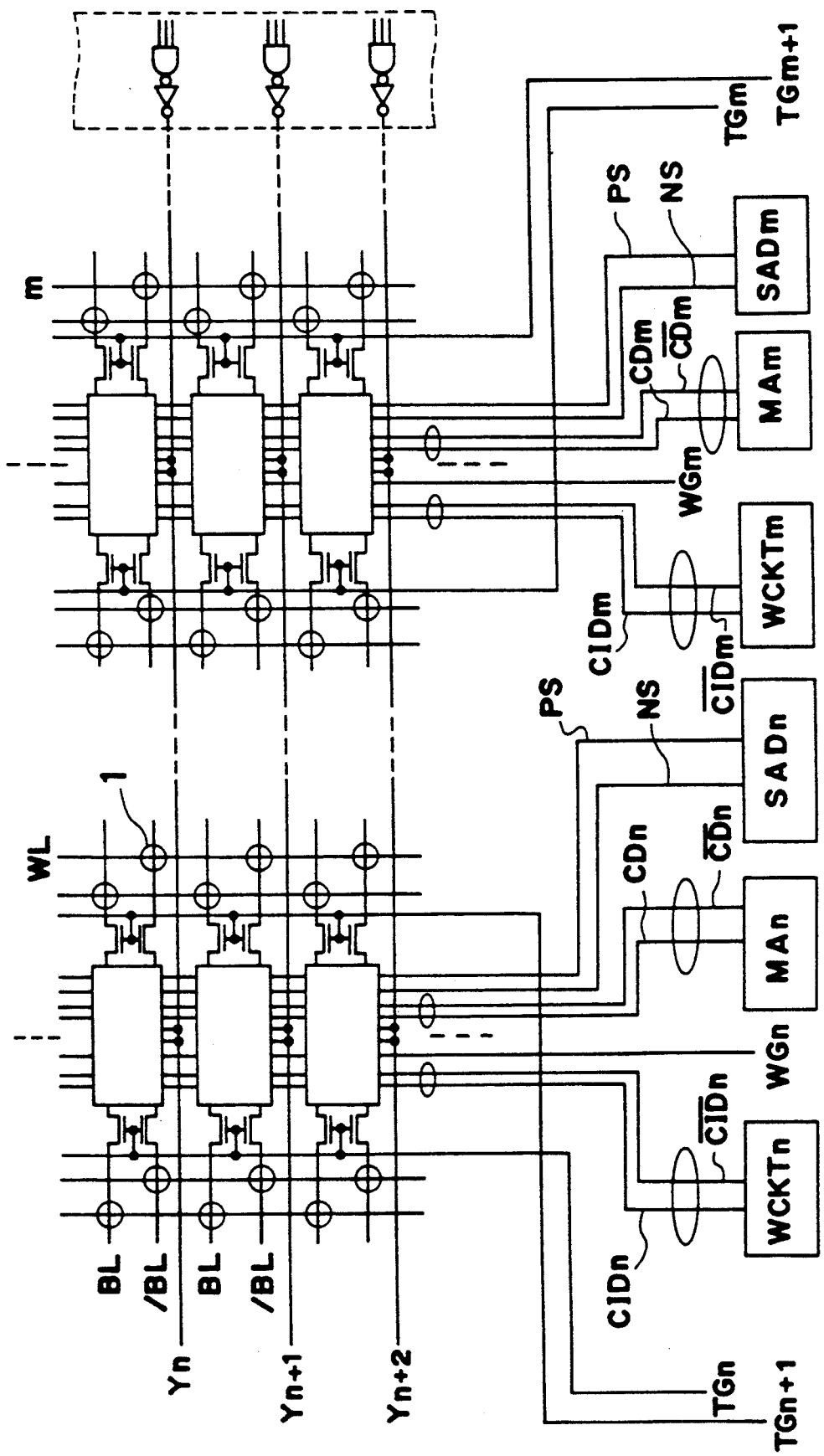
FIG. 2 is a circuit diagram of a prior art dynamic RAM employing the sense amplifier of FIG. 1.
Figure 3:
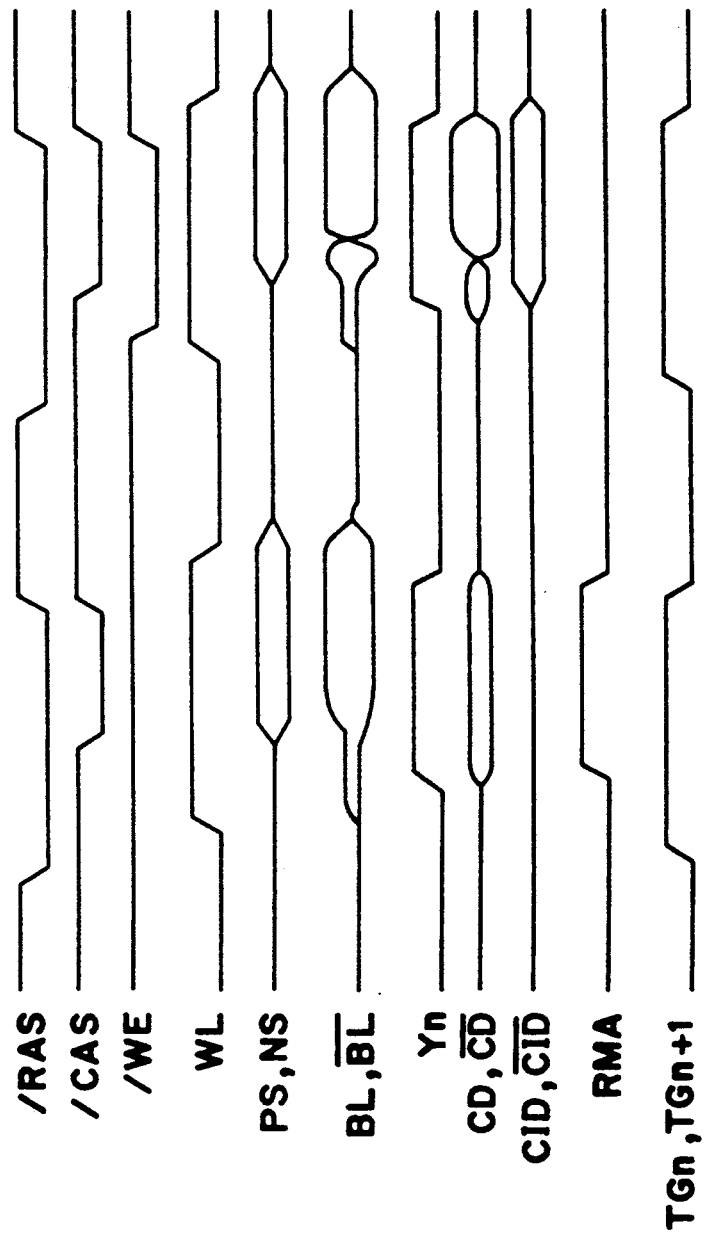
FIG. 3 is graph of waveforms showing the operation of the circuit of FIG. 2.
Figure 5:
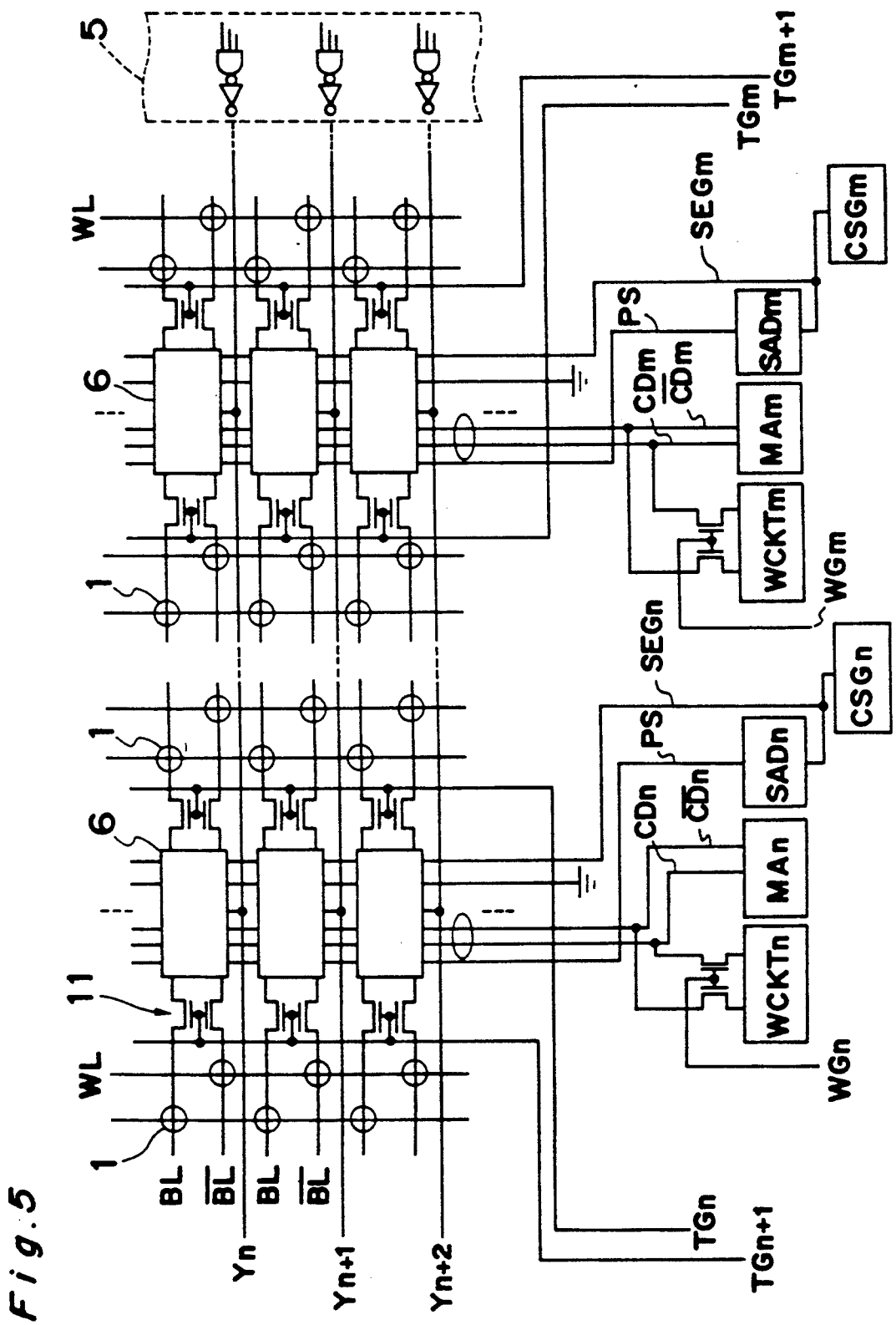
FIG. 5 is circuit diagram of a dynamic RAM employing the sense amplifier of FIG. 4.

Referring to FIG. 5, the position of the sense amplifier 6 in a DRAM device is shown. It should be noted that like parts in FIG. 5 and FIG. 2 are indicated with like reference numbers.

In the DRAM device the sense amplifiers 6 are aligned in rows (i.e., vertically when viewed in FIG. 5). The cells 1, shown by circles, are disposed on opposite sides of each sense amplifier 6 through switching transistors 11 controlled by switching signals $TG_n$ and $TG_{n+1}$. (In FIG. 4, the switching transistors 11 are omitted.) The sense amplifiers 6 aligned in a row are connected to a common source bus PS, a common control bus SEG, a common data buses CD and $\overline{CD}$.

The source bus PS is connected to a sense amplifier drive circuit SAD, which is controlled by the sense amplifier activation signal.

The control bus SEG is connected to a control signal generator CSG.

The common data buses CD and $\overline{CD}$ are connected to a main amplifier circuit MA and also to a write circuit WCKT. The main amplifier circuit MA is activated during the read cycle of DRAM operation for detecting and amplifying the read signals on the common data buses CD and $\overline{CD}$. The main amplifier circuit MA, which detects and amplifies the potential difference of the common data buses CD and $\overline{CD}$, is controlled via the control bus RMA. The main amplifier circuits MA are not activated during the write cycle.

The write circuit WCKT is activated during the write cycle of DRAM operation for supplying the write signals on the common data buses CD and $\overline{CD}$. The write timing signal WG is generated according to the external write enable signal /WE (/ indicates that the signal is activated during the LOW level) and the column control bus. Switch control buses TGn 7 are also provided for separating the sense amplifier circuits.

The selection bus Yn is connected to a Y-drive circuit 5.

When compared with the prior art DRAM shown in FIG. 2, the DRAM shown in FIG. 5 has a control bus SEG, and has no input data bus pair CID, $\overline{CID}$.

The operation of the sense amplifier circuit of the first embodiment is described below with reference to FIG. 6.

Figure 6:
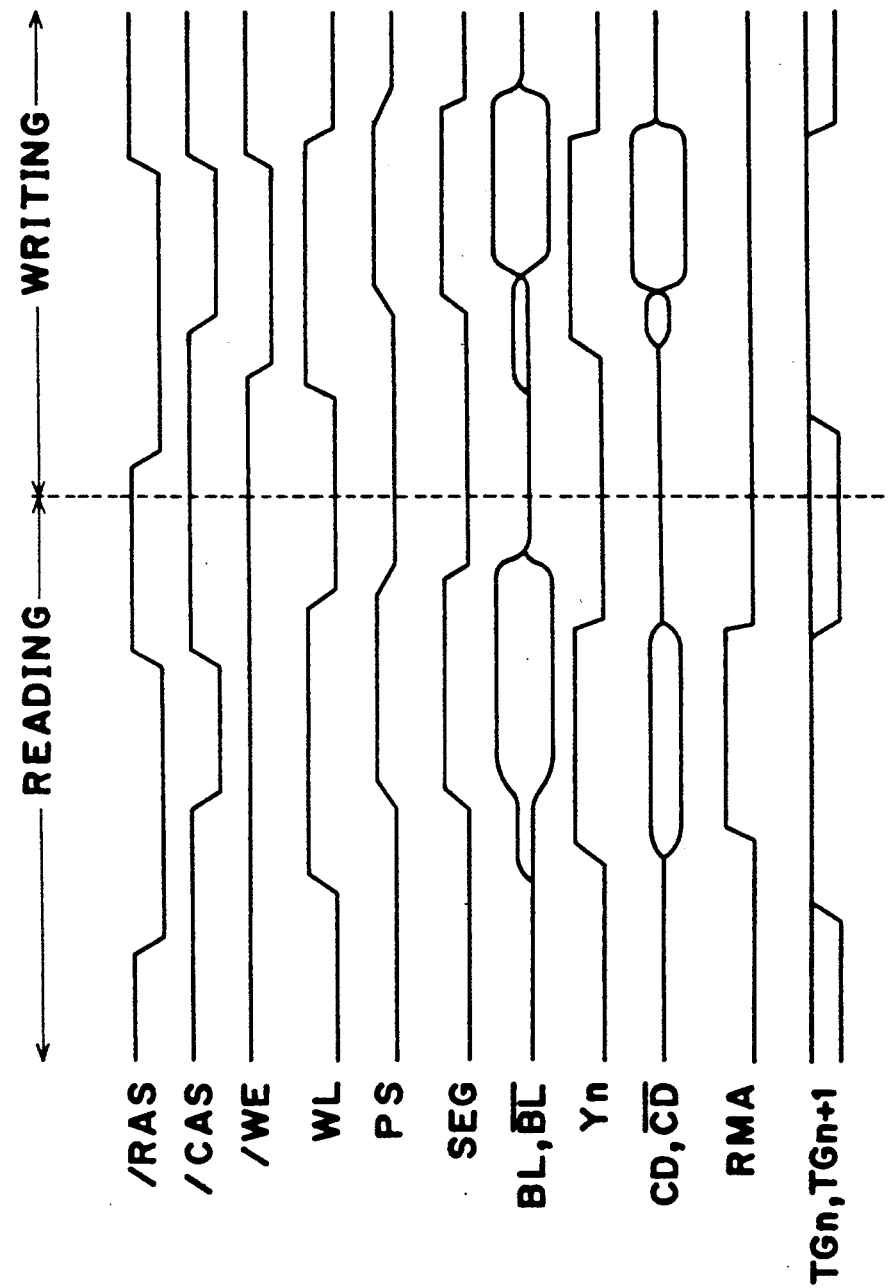
FIG. 6 is graph of waveforms showing the operation of the circuit of FIG. 5.

FIG. 6 shows row address strobe signal /RAS, column address strobe signal /CAS, write enable signal /WE, a row address selection signal, or word line signal, WL for reading the memory cell, a control bus signal RMA for the main amplifier circuit MA, and the separation switch control buses TGn for the shared sense amplifier circuit. The operation of these signals and buses is described next.

First, the reading cycle is described. When /RAS is LOW and WL is HIGH, a charge stored in a capacitor of a cell 1 is directed to a bit line BL or $\overline{BL}$, so that a potential difference is created across the bit bus pair BL and $\overline{BL}$. The n-sense amplifier circuit of Q11 and Q12 detects this potential difference so that the potential difference appears between junctions J2 and J3. Then, when the column selection bus Yn is made HIGH, MOSFETs Q3 and Q4 are turned on so that the potential difference as produced between Q11 and Q12, i.e., between junctions J2 and J3 is transmitted to the common data buses CD and $\overline{CD}$. Then, the RMA signal is applied to the main amplifier MA to read out the data transmitted through the data buses CD and $\overline{CD}$. Thereafter, the first control bus SEG is set to HIGH, and the source bus PS is also set to HIGH, resulting in the refreshing of the bit bus pair BL and $\overline{BL}$.

Next, the recording cycle is described. When /RAS is LOW and WL is HIGH, the cell 1, such as the one connected to a bus line $\overline{BL}$ is opened. Thus, a potential difference is created across the bit bus pair BL and $\overline{BL}$. At this time, a write enable signal /WE is made HIGH so that the data to be written is transmitted from the write circuit WCKT to the data buses CD and $\overline{CD}$. Then, when the column selection bus Yn is made HIGH to turn on the MOSFETs Q3 and Q4, the data presented across the data buses CD and $\overline{CD}$ is transmitted through MOSFETs Q3 and Q4 to junctions J2 and J3. Then, when the first control bus SEG is set to HIGH, and the source bus PS is also set to HIGH, the data transmitted across the junctions J2 and J3 through MOSFETs Q3 and Q4 is further transmitted though MOSFETs Q13 and Q14 to bus lines BL and $\overline{BL}$. The data as presented to the bus lines BL and $\overline{BL}$ is amplified by MOSFETs Q9 and Q10 of amplifying circuit 4, and is stored in the cell 1 which is opened. Then, the cell closes by setting the word line WL LOW, thereby completing the recording cycle.

Figure 1:
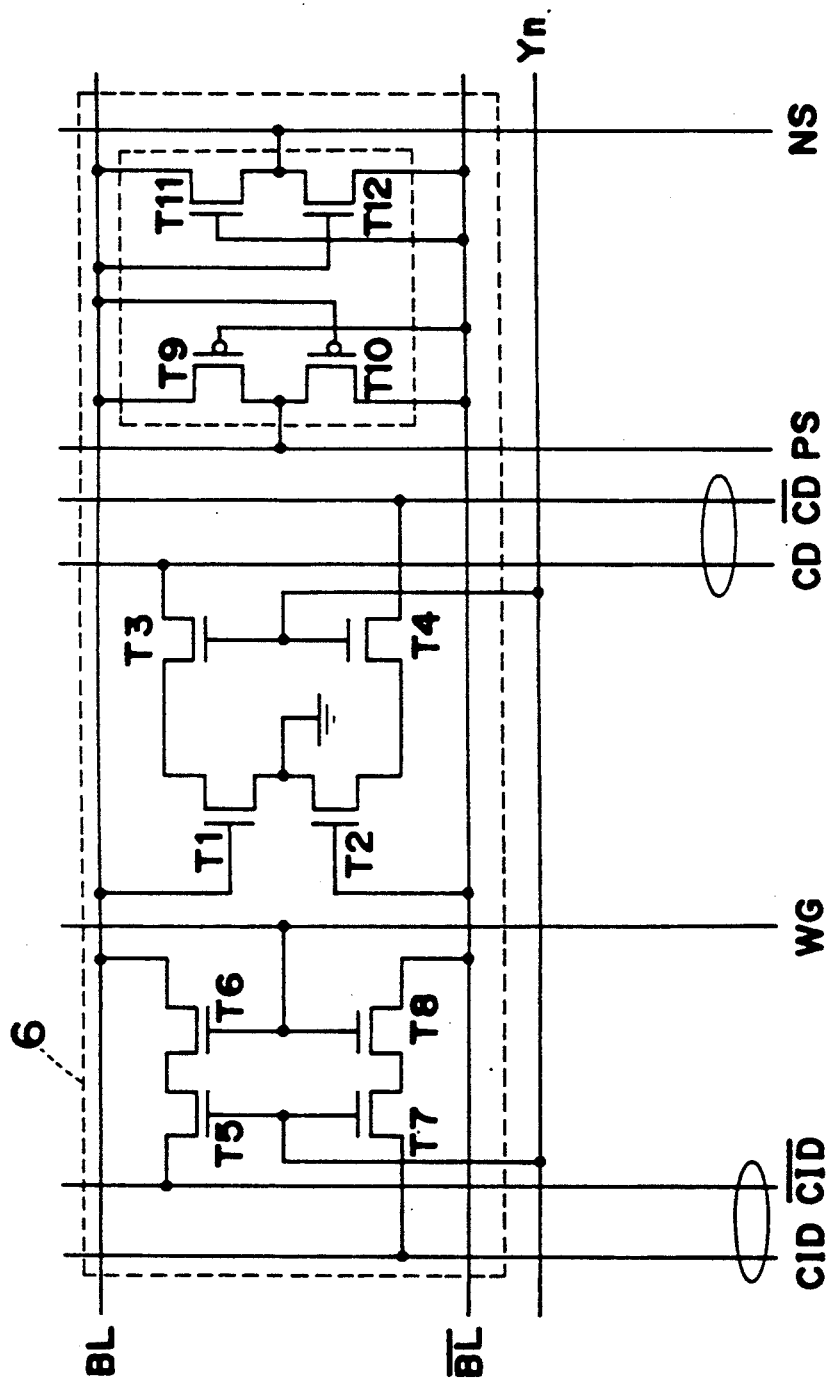
FIG. 1 is a circuit diagram of a sense amplifier according to a prior art.

Direct bit bus sensing is thus possible according to the first embodiment of the invention without significantly increasing the number of circuits and buses as is necessary by the prior art shown in FIG. 1 by simply providing two transistors Q13 and Q14 in the CMOS refreshing amplifier. There is, therefore, virtually no increase in the required chip size, and high speed reading is possible.

It is to be noted that the common source bus NS for the first sense amplifier circuit section was shown grounded in this embodiment, but the common source bus NS can also be connected directly to a power supply bus with a potential lower than the precharge potential of the bit bus, and if the first sense amplifier circuit 2 is composed of a p-sense amplifier circuit, then the common source bus NS can be directly connected to a high potential power supply bus.

Second embodiment

A second embodiment of the present invention is described below with reference to FIGS. 7 and 8. In the first embodiment, the junction J1 between Q11 and Q12 is connected to ground, but in the second embodiment, the junction J1 is connected to a common source bus NS which is further connected to ground through each of transistors Q15 and Q16. The common source bus NS is also connected through a transistor to a common source bus PS.

A signal SFG applied to the gate of transistor Q16 is set LOW so that Q16 becomes ON before WL becomes HIGH, and the common source bus NS potential is adjusted so that the transistors Q11 and Q21 are weakly turned ON. Direct bit bus sensing is executed at this potential. The SEG is then set HIGH to turn Q15 ON, and the common source bus NS potential is then set to the ground potential to refresh the bit buses.

The transistors Q11 and Q12 thus operate at near the threshold voltage, the transistor of which the gate is connected to the high potential bit bus is strongly turned ON, and the transistor of which the gate is connected to the low potential bit bus is not strongly turned ON. The common data buses CD and $\overline{CD}$ are not, therefore, discharged more than is necessary. Thus, operation can avoid being excessively affected by an imbalance in storage capacity, through-current can be suppressed, and low power consumption operation can be achieved.

Figure 8:
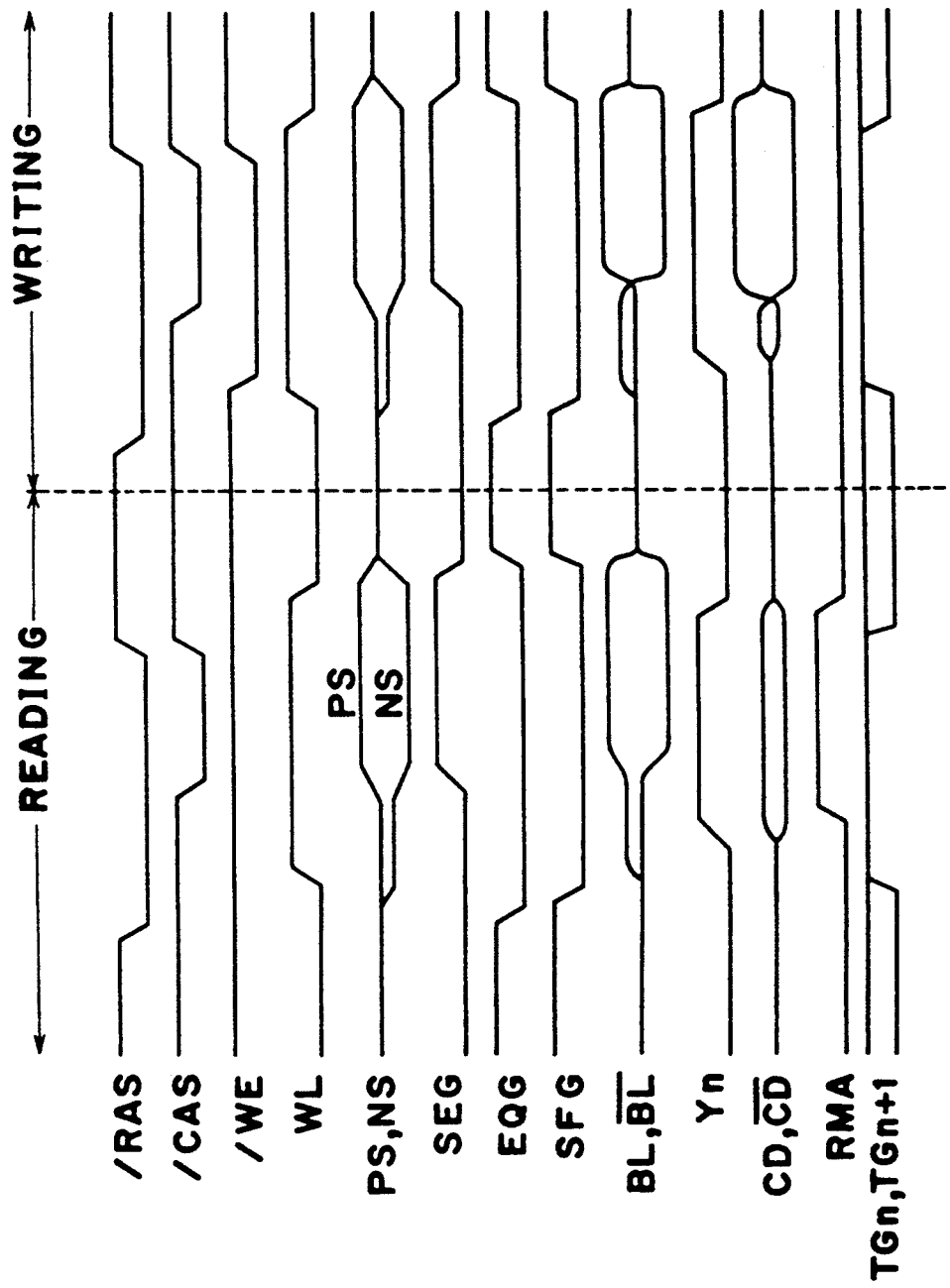
FIG. 8 is graph of waveforms showing the operation of the circuit of FIG. 7.

In the second embodiment, as shown in FIG. 8, the potential supplied to the common source bus NS of the first sense amplifier circuit 2 makes a first change in the negative direction before a potential difference occurs in the bit buses, and then makes a second change in the same direction as the first change in response to the signal SEG. Alternatively, if the first sense amplifier circuit 2 is a p-sense amplifier circuit, the first change in the potential can in the positive direction before a potential difference occurs in the bit bus, and the second change should be made in response to the signal SEG in the same direction as the first change.

Third embodiment

Figure 9:
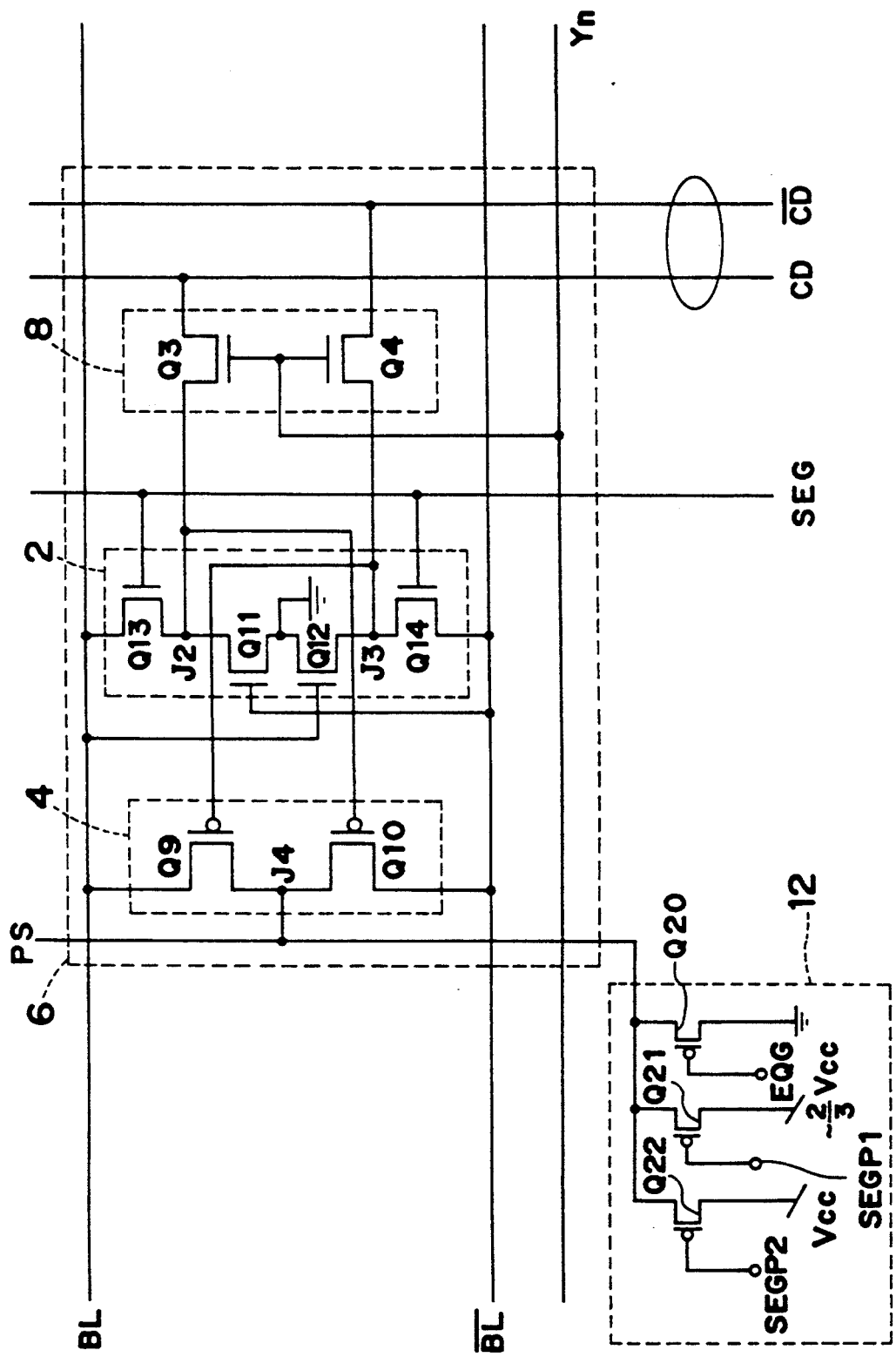
FIG. 9 is a circuit diagram of a sense amplifier according to a third embodiment of the present invention.

A third embodiment of the present invention is described below with reference to the circuit diagrams in FIGS. 9 an 10. In the first embodiment shown in FIGS. 4 and 5, the junction J4 between Q9 and Q10 of the p-sense amplifier circuit 4 is connected to the common source bus PS which is in turn connected to the sense amplifier drive circuit SAD, but in the third embodiment, the junction J4 between Q9 and Q10 is connected to a voltage source 12 which can selectively provide a voltage Vcc, ½Vcc or 0. The voltage source 12 includes transistors Q20, Q21 and Q22. The gate of transistor Q20 receives EQG, the gate of Q21 receives SEGP1 and the gate of Q22 receives SEGP2.

Furthermore, in the first embodiment, the gates of MOSFETs Q9 and Q10 of the p-sense amplifier circuit 4 are connected to bit lines $\overline{BL}$ and BL, respectively, but in the third embodiment, the gates of Q9 and Q10 are connected to junctions J3 and J2, respectively.

Figure 10:
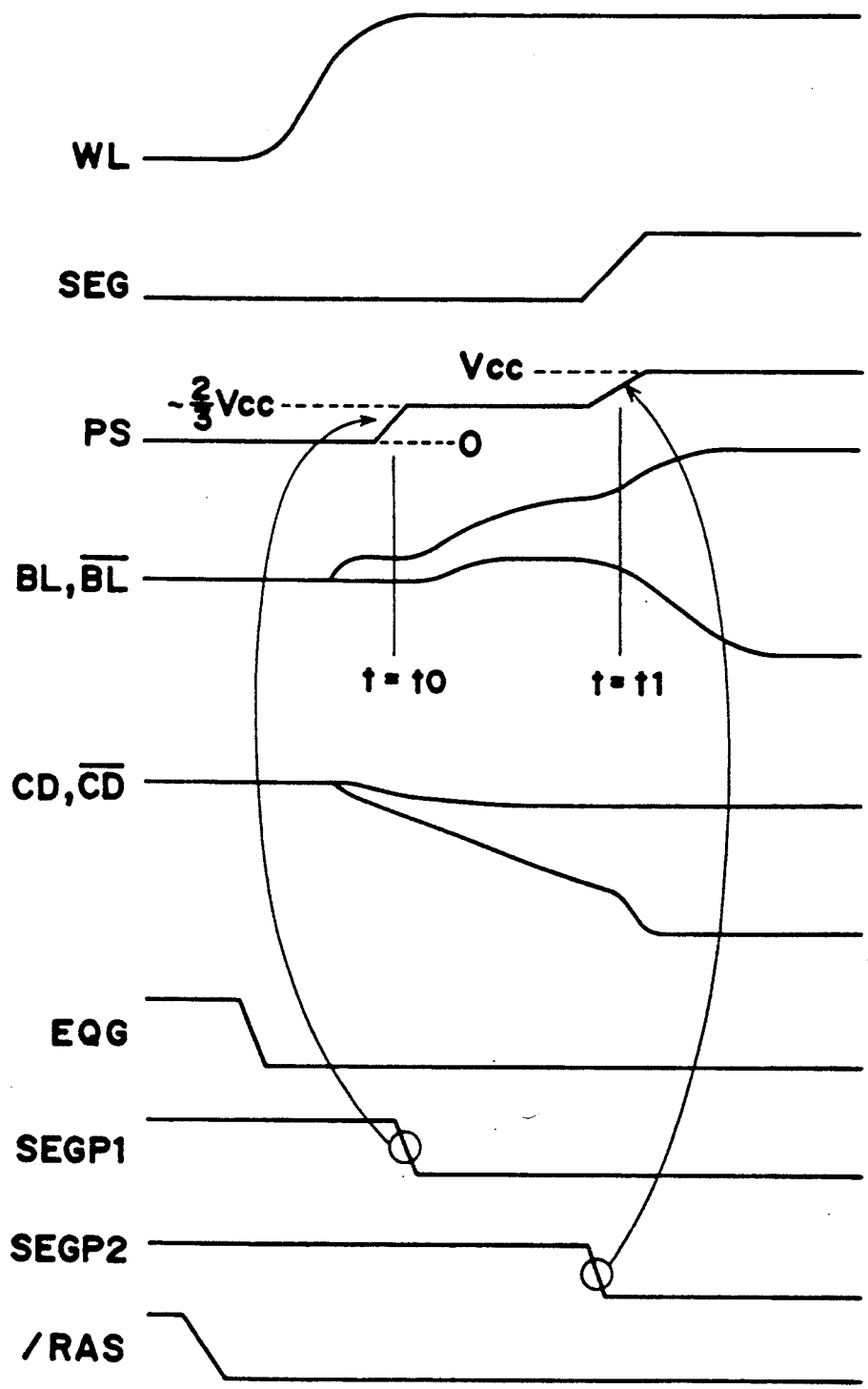
FIG. 10 is graph of waveforms showing the operation of the circuit of FIG. 9.

As shown in FIG. 10, the common source bus PS potential is boosted approximately ½Vcc by the SEGP 1 to support direct bit bus sensing after a potential difference occurs in the bit buses BL and $\overline{BL}$ and after a potential difference occurs between the junctions J2 and J3 (t=t0). The common source bus PS potential is then boosted to Vcc by SEGP 2 simultaneously with the change (t=t1) in the first control bus SEG to refresh the bit buses.

Thus, because the gates of Q9 and Q10 are respectively connected not to bit lines BL and $\overline{BL}$, but to junctions J3 and J2, a low level can be quickly set, and the HIGH bit bus potential can be boosted to the common source bus PS potential by the p-sense amplifier circuit Q9 and Q10 as shown in FIG. 10. Thus the gates to Q11 and Q12 becomes HIGH, and data appearing across junctions J2 and J3 can be transmitted to the common data buses CD and $\overline{CD}$ at high speed.

Fourth embodiment

A fourth embodiment of the present invention is described below with reference to FIGS. 11 and 12. In the third embodiment, the common source bus PS is connected to the voltage source 12, but in the fourth embodiment, the junction J4 is connected to the common source bus PS which is in turn connected to transistor Q17 to a voltage Vcc. Also, the junction J4 is connected to transistor Q18 to the column selection bus Yn.

Figure 11:
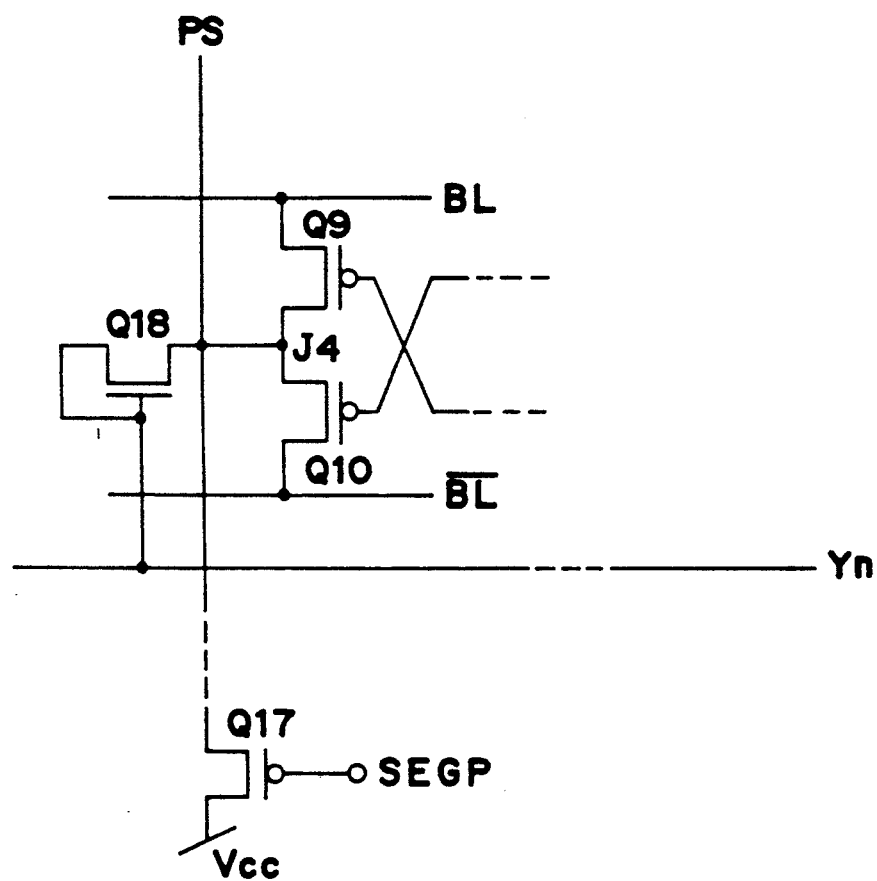
FIG. 11 is a circuit diagram of a sense amplifier according to a fourth embodiment of the present invention.
Figure 12:
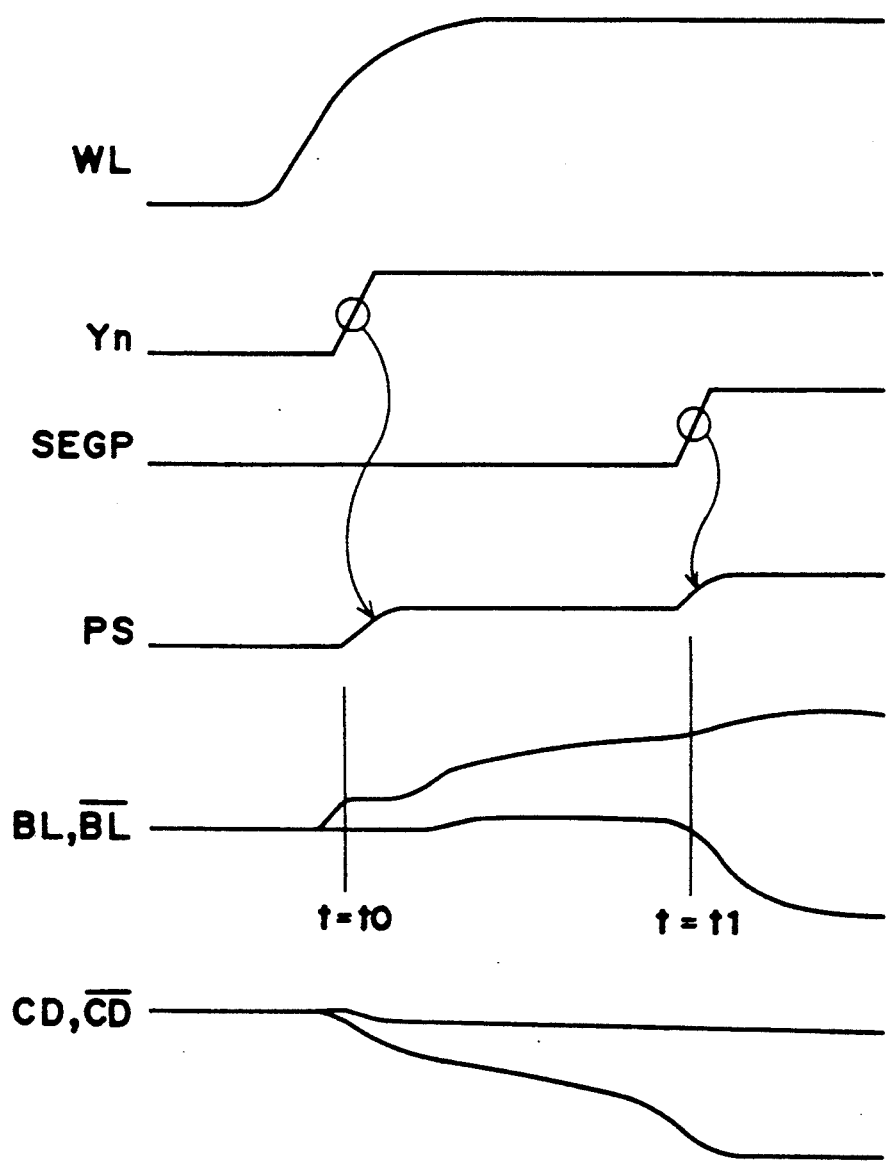
FIG. 12 is graph of waveforms showing the operation of the circuit of FIG. 11.

As shown in FIGS. 11 and 12, after a potential difference occurs in the bit lines BL and $\overline{BL}$, and after the potential difference occurs between the junctions J2 and J3 (t=t0), the common source bus PS potential is boosted by the column selection bus Yn to an intermediate potential which is little less than HIGH, that is a level equal to: the HIGH potential Vyn of the column selection bus Yn subtracted by an amount equal to the threshold voltage Vtn of the transistor Q18. By the intermediate potential, the direct bit bus sensing is supported. The common source bus PS potential is then boosted from the intermediate potential to HIGH potential (Vcc) so as to refresh the bit buses.

The same effect as that of the third embodiment can thus be obtained. Furthermore, two transistors Q13 and Q14 can be omitted, and a timing margin is unnecessary because the timing of the control signals controlling the gates is uniformly determined.

Fifth embodiment

A fifth embodiment of the present invention is described below with reference to FIGS. 13, 14 and 15. In the fifth embodiment, as shown in FIG. 14, the column selection bus Yn is used to produce a first column control bus CL and a second column control bus SACL.

Figure 13:
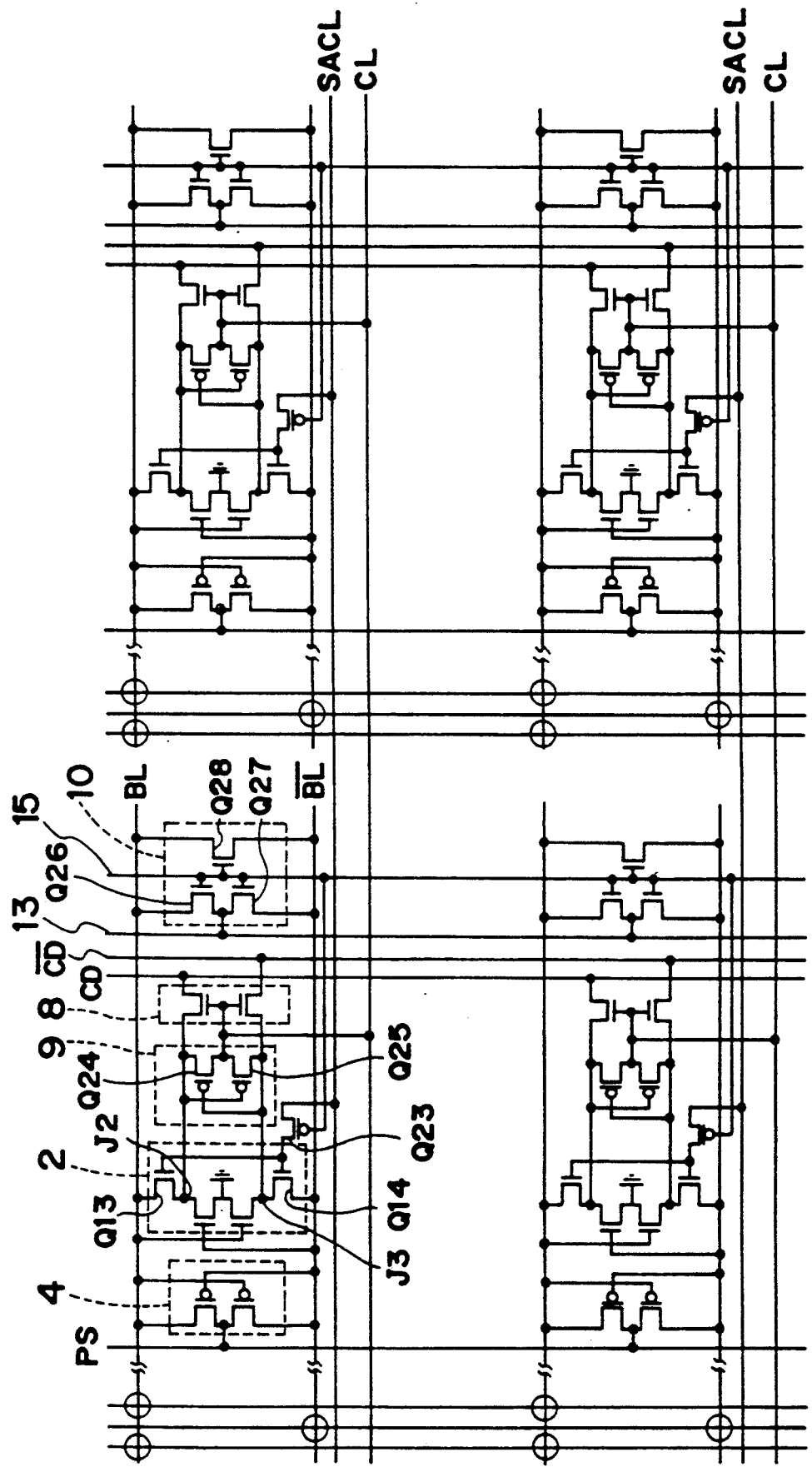
FIG. 13 is a circuit diagram of a sense amplifier according to a fifth embodiment of the present invention.
Figure 14:
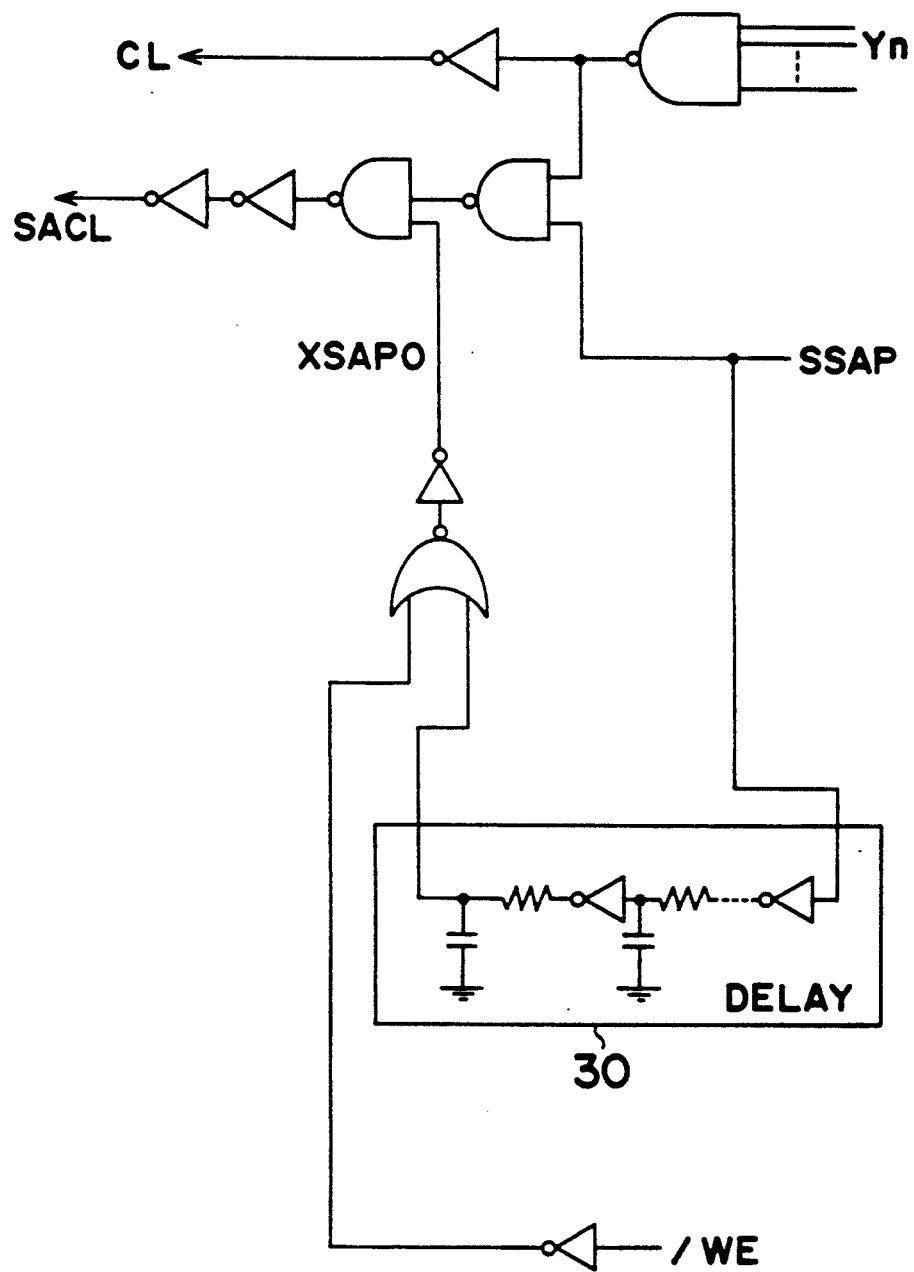
FIG. 14 is a circuit diagram of a Y-drive circuit for producing a first column control bus CL and a second column control bus SACL.

Referring to FIG. 13, in the fifth embodiment, the gates of MOSFETs Q13 and Q14 are connected to p-type MOSFET Q23 and further to a second column control bus SACL. The gate of Q23 is connected to a precharge control bus 15. The gate circuit 8 is turned ON and OFF by the first column control bus CL.

Furthermore, in the fifth embodiment, an amplifier circuit 9 is inserted between junctions J2 and J3 to further enhance the voltage difference therebetween. The amplifier circuit 9 includes p-type MOSFETs Q24 and Q25.

Also, a precharge circuit 10 including n-type MOSFETs Q26, Q27 and Q28 is provided between the bit lines BL and $\overline{BL}$.

Figure 15:
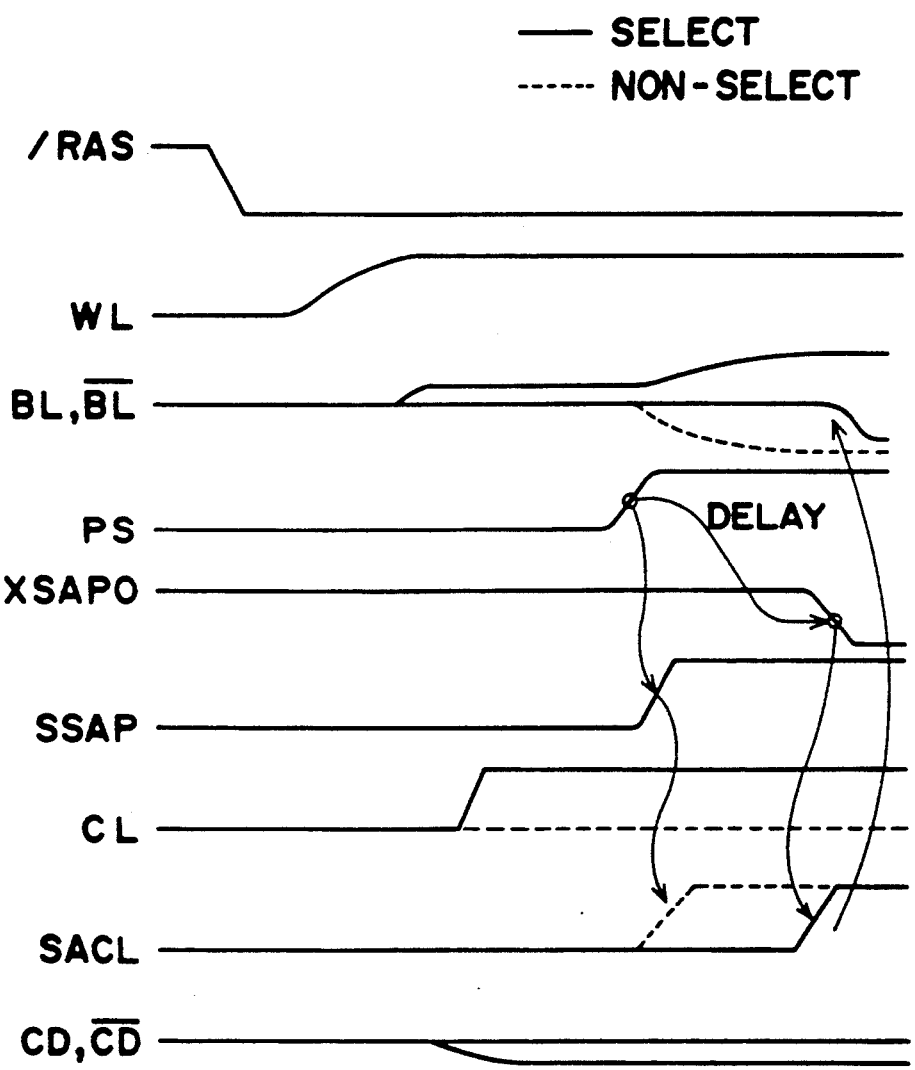
FIG. 15 is graph of waveforms showing the operation of the circuit of FIG. 13.

In operation, as shown in FIG. 15, the second column control bus SACL, after receiving a LOW level signal /RAS (row address strobe), is applied to the gates of MOSFETs Q13 and Q14 for maintaining Q13 and Q14 inoperative. During the reading cycle the second column control bus SACL is so controlled to have an opposite logic to the logic of the first column control bus CL, but during the writing cycle the second column control bus SACL is changed to HIGH regardless of the column selection bus Yn to turn Q13 and Q14 on. Thus, Q11 and Q12 between the junctions J2 and J3 are enabled to provide the voltage at common data buses CD and $\overline{CD}$ to the bit lines BL and $\overline{BL}$.

Then, when Q13 and Q14 are turned ON by the second column control bus SACL the refreshing of the bit lines BL and $\overline{BL}$ starts. As shown in FIG. 14, the control of the second column control bus SACL is such that, in response to the rise of the common source bus PS, only the second column control bus SACL, which is controlling the non-selected bit line, rises while maintaining the second column control bus SACL, which is controlling the selected bit line. Thereafter, second column control bus SACL rises by the delayed common source bus PS, as delayed by delay circuit 30.

According to the fifth embodiment, since the MOSFETs Q11 and Q12 are always maintained in the active condition, the potential difference appearing across the bit lines BL and $\overline{BL}$ can be immediately transmitted to the common data buses CD and $\overline{CD}$. Thus, time relationship with respect to the word line WL is not necessary, resulting in fast reading and simple designing. Furthermore, since junction J1 is connected to the line Vss (ground), it is possible to reduce the amplification delay.

It is to be noted that the MOSFET Q23 controlled by the LOW address is provided for reducing the load of the second column control bus SACL, but it can be eliminated so that the second column control bus SACL is connected directly to the gates of Q13 and Q14.

Also, the circuit for producing the second column control bus SACL shown in FIG. 14 can be changed so that Q13 and Q14 is controlled to be OFF during a certain period.

Sixth embodiment

Figure 16:
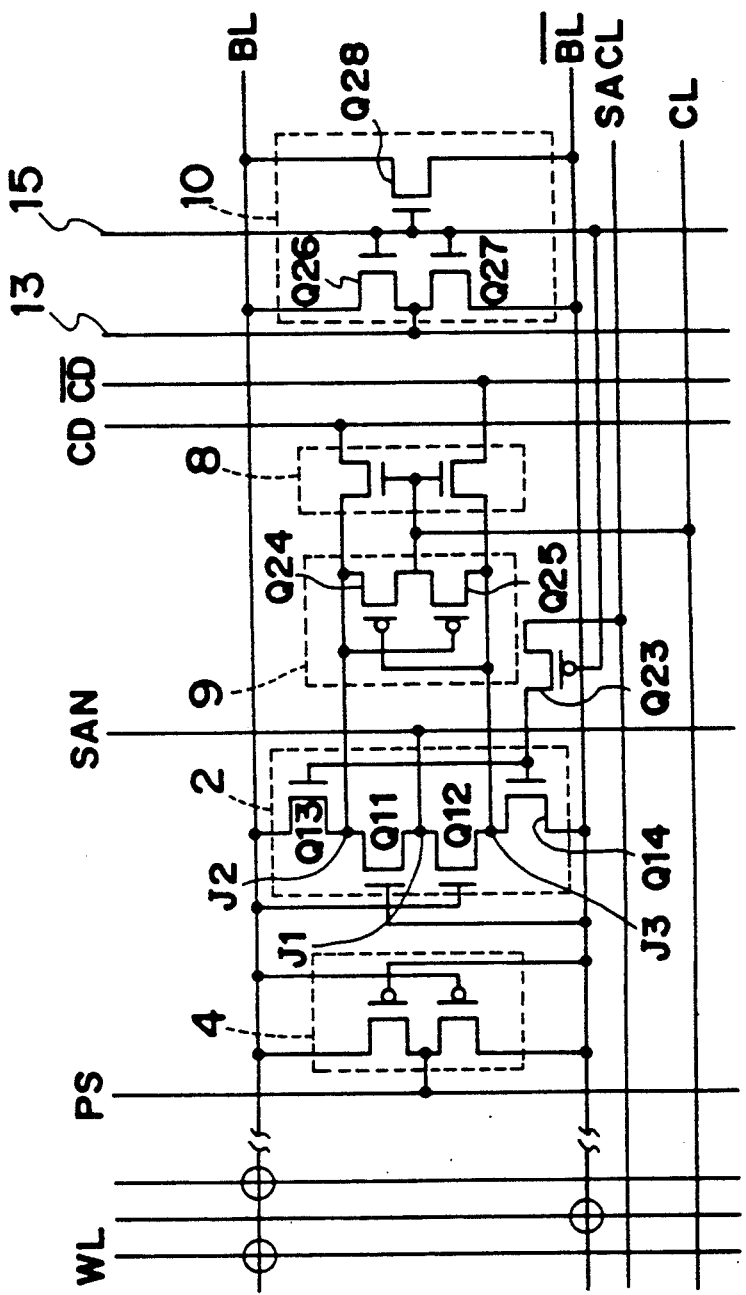
FIG. 16 is a circuit diagram of a sense amplifier according to a sixth embodiment of the present invention.
Figure 17:
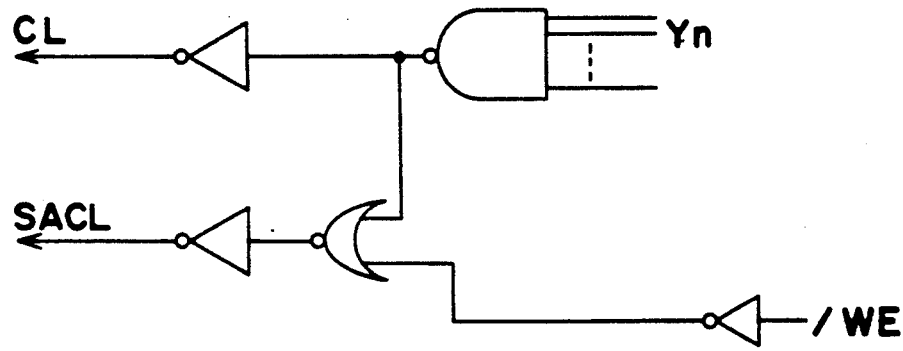
FIG. 17 is a circuit diagram similar to FIG. 14, but showing a modification used for the sixth embodiment.

A sixth embodiment of the present invention is described below with reference to FIGS. 16, 17 and 18. In the sixth embodiment, as shown in FIG. 17, the column selection bus Yn is used to produce a first column control bus CL and a second column control bus SACL.

Figure 7:
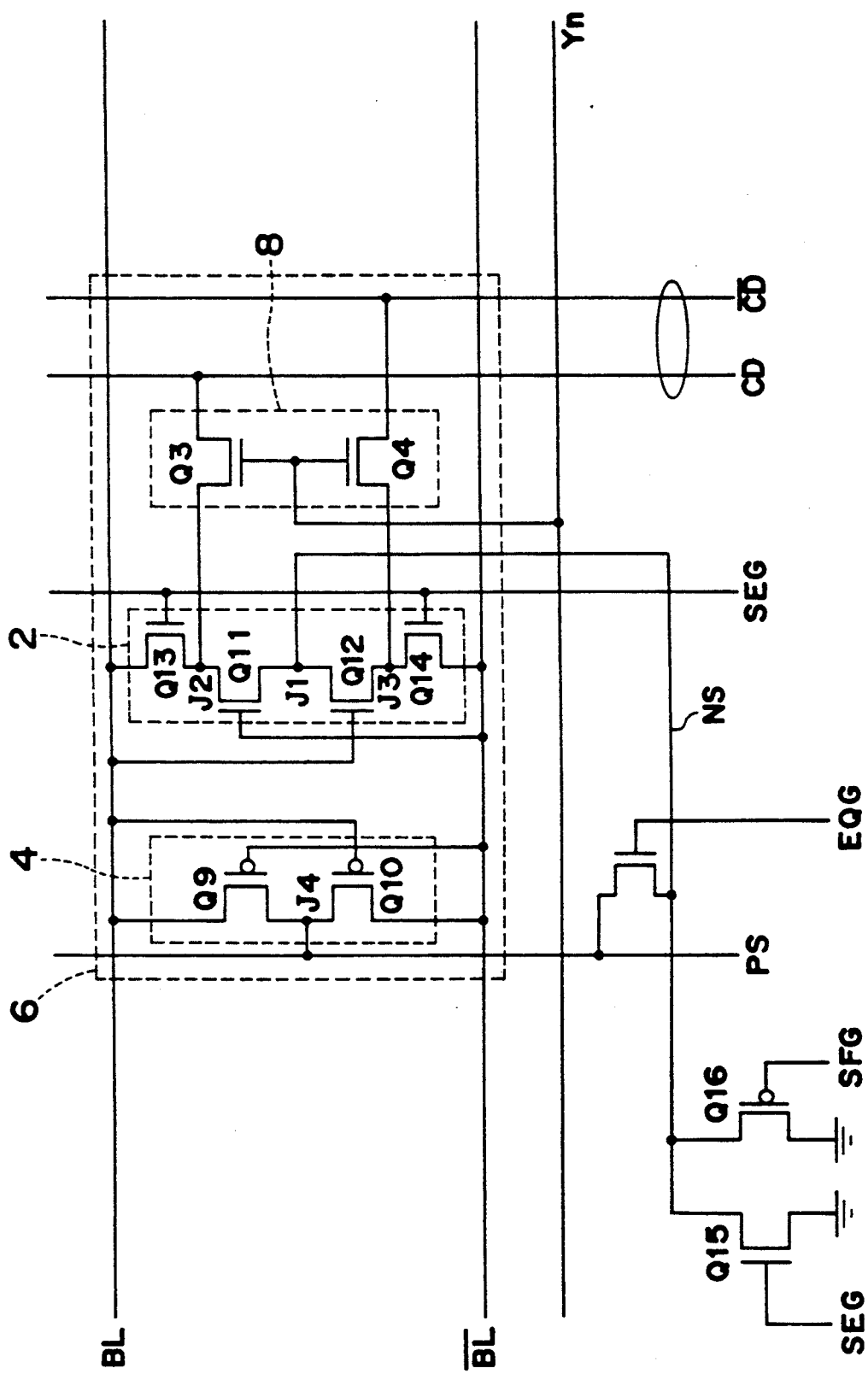
FIG. 7 is a circuit diagram of a sense amplifier according to a second embodiment of the present invention.

In the fifth embodiment, the junction J1 is connected to ground, but in the sixth embodiment, the junction J1 is connected to a control line SAN, in a manner similar to that shown in FIG. 7. The control line SAN has a logic opposite to the logic of the common source bus PS, as shown in FIG. 18.

Figure 18:
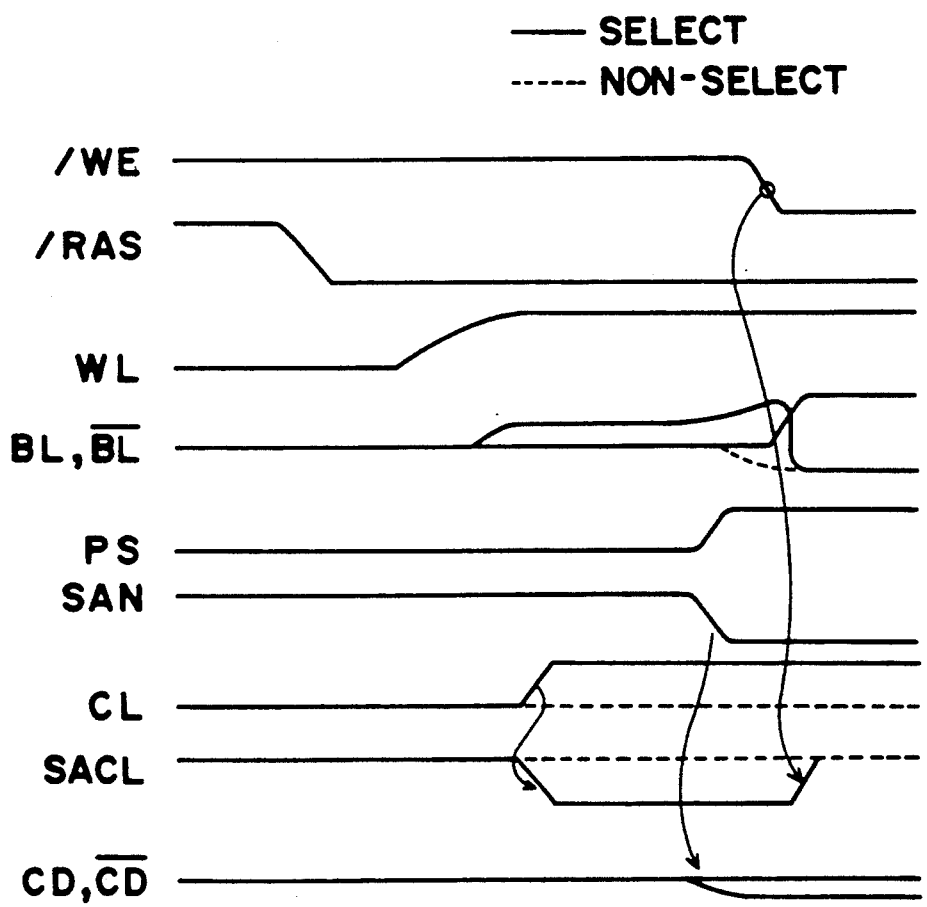
FIG. 18 is graph of waveforms showing the operation of the circuit of FIG. 16.

In operation, as shown in FIG. 18, the control line SAN, after receiving a LOW level signal /RAS (row address strobe), is made LOW to activate Q11 and Q12. During the reading cycle the second column control bus SACL is so controlled to have an opposite logic to the logic of the first column control bus CL, but during the writing cycle the second column control bus SACL is changed to HIGH regardless of the column selection bus Yn to turn Q13 and Q14 on. Thus, Q11 and Q12 between the junctions J2 and J3 are enabled to provide the voltage at common data buses CD and $\overline{CD}$ to the bit lines BL and $\overline{BL}$.

Then, for the non-selected bit lines, when Q13 and Q14 are turned ON by the second column control bus SACL the refreshing of the bit lines BL and $\overline{BL}$ starts. For the selected bit lines, since Q13 and Q14 are maintained OFF, the potential difference between the bit lines will not change even after the connected to the common data buses CD and $\overline{CD}$.

According to the sixth embodiment, as to the non-selected bit lines, the amplification operation starts early, but as to the selected bit lines, the amplification operation will be carried out later, but in high speed.

Seventh embodiment

Figure 19:
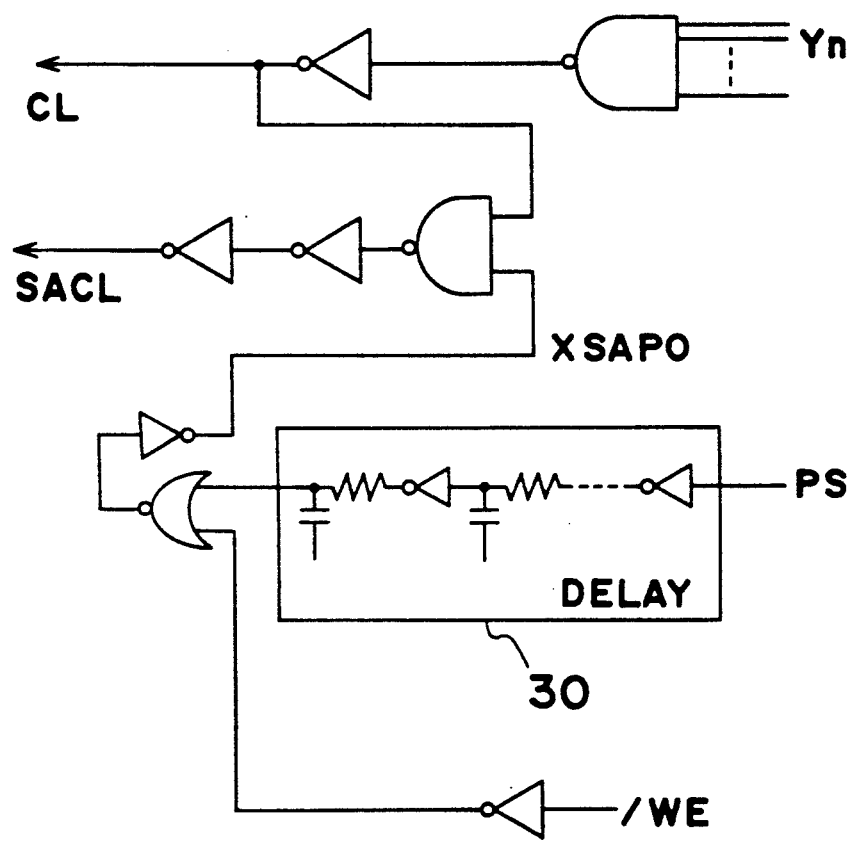
FIG. 19 is a circuit diagram similar to FIG. 14, but showing a modification used for the seventh embodiment.
Figure 20:
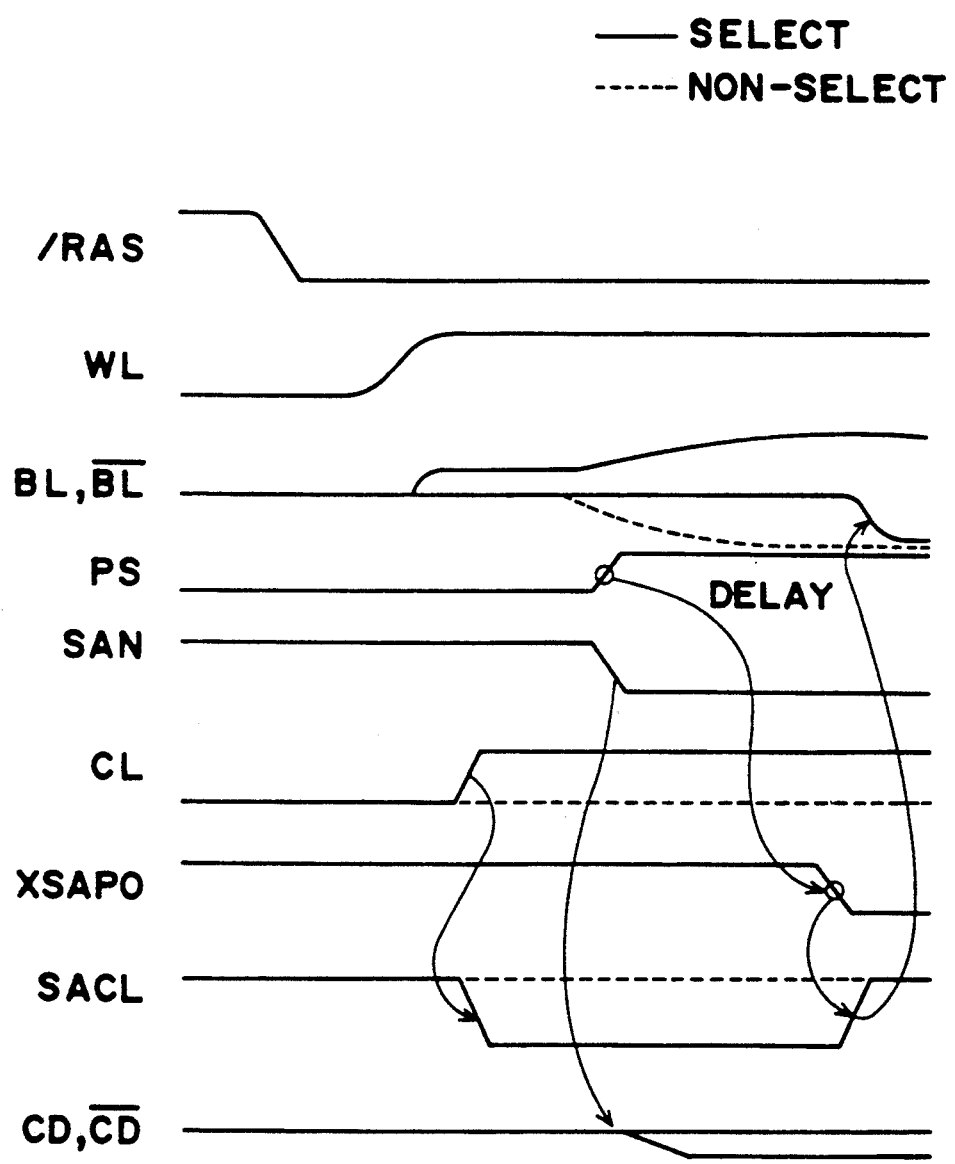
FIG. 20 is graph of waveforms showing the operation of the circuit of FIG. 19.

A seventh embodiment of the present invention is described below with reference to FIGS. 19 and 20. In the seventh embodiment, as shown in FIG. 19, the circuit for producing the first column control bus CL and a second column control bus SACL is simplified.

In response to the rising of the first column control bus CL, the second column control bus SACL falls. Then, the second column control bus SACL rises in response to the delayed common source bus PS, which is delayed by delay circuit 30.

By the seventh embodiment, if the potential difference between the bit lines is sufficient, the amplification operation by Q11 and Q12 can be started before completing the reading cycle, thereby enabling the fast reading operation.

It is to be noted that in any of the embodiments described hereinabove p-MOSFET devices may be used for n-MOSFET devices, and n-MOSFET devices may be used for p-MOSFET devices. Furthermore, MOSFET devices may be substituted for bipolar transistors and other transistors.

As is described fully, according to the present invention, the common data buses CD and $\overline{CD}$ can be used for both reading and writing the data, and at the same time, the direct bit bus sensing can be accomplished with a simple circuit arrangement. Thus, the size of the DRAM can be reduced and, at the same time, the reading speed can be increased.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A read/write circuit for use in a dynamic RAM having a plurality of cells connected to a first and second bit lines, and for transferring data from said cells to first and second data bus, or vice versa, said read/write circuit comprising:
    first sense amplifier means comprising first, second, third and fourth transistors connected in series between said first and second bit lines, a gate of said second transistor connected to said second bit line, a gate of said third transistor connected to said first bit line;
    a first junction defined by the connection of said first transistor to said second transistor;
    a second junction defined by the connection of said third transistor to said fourth transistor;
    a gate circuit means connected between said first data bus and said first junction and also connected between said second data bus and said second junction;
    a gate control signal source for providing a gate control signal which opens and closes said gate circuit means; and
    a write control signal source for providing a write control signal to a gate of each of said first and fourth transistors,
    whereby during a writing cycle, said gate control signal opens said gate circuit means, and then said write control signal enables said first and fourth transistors to enable access from said first and second data buses to said first and second bit lines, and during a reading cycle, said write control signal disables said first and fourth transistors to produce an amplified bit line data between said first and second junctions, and then said gate control signal opens said gate circuit means to supply said amplified bit line data to said first and second data buses.

2. A read/write circuit as claimed in claim 1, wherein said gate circuit means comprises fifth and sixth transistors, said fifth transistor connected between said first junction and said first data bus, and said sixth transistor connected between said second junction and said second data bus, said gate control signal being applied to gates of said fifth and sixth transistors.

3. A read/write circuit as claimed in claim 1, wherein a third junction defined by the connection of said second transistor to said third transistor is connected to a voltage source which is lower than a precharged level.

4. A read/write circuit as claimed in claim 1, further comprising:
    a second sense amplifier means which comprises seventh and eighth transistors connected in series between said first and second bit lines, a gate of said seventh transistor connected to said second bit line, a gate of said eighth transistor connected to said first bit line;
    a fourth junction defined by the connection of said seventh transistor to said eighth transistor; and
    a sense amplifier drive circuit connected to said fourth junction for providing a drive signal.

5. A read/write circuit as claimed in claim 4, wherein said gate of said seventh transistor is connected to said second bit line, and said gate of said eighth transistor is connected to said first bit line.

6. A read/write circuit as claimed in claim 4, wherein said gate of said seventh transistor is connected to said second junction and, through said fourth transistor, is selectively electrically connected to said second bit line, and said gate of said eighth transistor is connected to said first junction and, through said first transistor, is selectively electrically connected to said first bit line.

7. A read/write circuit as claimed in claim 6, wherein said sense amplifier drive circuit produces said drive signal which increases the voltage in steps.

8. A read/write circuit as claimed in claim 4, wherein said sense amplifier drive circuit is connected to said gate control signal source for adding said drive signal to said gate control signal to refresh the first and second bit lines.

9. A read/write circuit as claimed in claim 1, wherein a third junction between said second and third transistors is connected to a variable voltage source.

10. A read/write circuit as claimed in claim 1, wherein said write control signal source is formed from said gate control signal.

11. A read/write circuit as claimed in claim 10, wherein said write control signal source produces a signal which, after receiving a LOW level signal, is applied to the gates of said first and fourth transistors to maintain said first and fourth transistors inoperative for a predetermined time.

* * * * *

UNITED STATES PATENT AND TRADEMARK OFFICE
CERTIFICATE OF CORRECTION

PATENT NO. : 5,295,103
DATED : March 15, 1994
INVENTOR(S) : Yamauchi

It is certified that error appears in the above—identified patent and that said Letters Patent is hereby corrected as shown below:

On title page, item
[22] the filing date should be changed from "April 20, 1993" to --April 20, 1992--.

Signed and Sealed this

Sixteenth Day of August, 1994

BRUCE LEHMAN

Attest:

Attesting Officer          Commissioner of Patents and Trademarks